(12) United States Patent
Lee et al.

(10) Patent No.: US 9,529,124 B2
(45) Date of Patent: Dec. 27, 2016

(54) OPTICAL FILM STRUCTURE HAVING A LIGHT ABSORBING LAYER THAT IMPROVES THE CONTRAST OF THE DISPLAY APPARATUS

(71) Applicant: INDUSTRIAL TECHNOLOGY RESEARCH INSTITUTE, Hsinchu (TW)

(72) Inventors: Cheng-Chung Lee, Hsinchu (TW); Yu-Ju Chao, Zhubei (TW); Chia-Yu Wu, Beinan Township (TW); Kuo-Chang Lee, Pingtung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/846,444

(22) Filed: Sep. 4, 2015

(65) Prior Publication Data
US 2016/0238748 A1 Aug. 18, 2016

(30) Foreign Application Priority Data
Feb. 16, 2015 (TW) .............................. 104105311 A

(51) Int. Cl.
*H01L 27/15* (2006.01)
*H01L 31/12* (2006.01)
(Continued)

(52) U.S. Cl.
CPC ............. *G02B 5/003* (2013.01); *G02B 3/0056* (2013.01); *H01L 51/5012* (2013.01);
(Continued)

(58) Field of Classification Search
CPC ..................... H01L 27/14625; H01L 27/14627; H01L 31/0543; H01L 51/5271; H01L 51/5275; H01L 51/5284
See application file for complete search history.

(56) References Cited

U.S. PATENT DOCUMENTS 8,067,888 B2   11/2011   Wu
8,330,361 B2   12/2012   Kim
(Continued)

FOREIGN PATENT DOCUMENTS

CN    101533850 A    9/2009
TW       357271      5/1999
(Continued)

OTHER PUBLICATIONS

Chen et al., "Fabrication of Light Extraction Efficiency of Organic Light-Emitting Diodes with 3D Aspherical Microlens by Using Dry Etching Process", Journal of Nanomaterials, vol. 2013, 2013, pp. 1-6.

(Continued)

*Primary Examiner* — Hoai V Pham
(74) *Attorney, Agent, or Firm* — Birch, Stewart, Kolasch & Birch, LLP

(57) ABSTRACT

An optical film structure includes a first substrate having a first surface and a second surface, an optical component includes a micro-lens array and disposed on the first surface of the first substrate, a micro-lens array including a plurality of micro-lens units each of which has a round concentrated area with a projected radius R formed on the first surface, a planarization layer disposed on the optical component, a light absorbing layer disposed on the planarization layer and including a plurality of light absorbing units each of which has a width W. Light incident from the second surface of the first substrate and passing through the micro-lens array is focused on the light absorbing units. The micro-lens array and the planarization layer have a difference in refractive index greater than or equal to 0.2; and W is less than or equal to R/2.

19 Claims, 10 Drawing Sheets

(51) Int. Cl.
  *H01L 33/00* (2010.01)
  *G02B 5/00* (2006.01)
  *G02B 3/00* (2006.01)
  *H01L 51/52* (2006.01)
  *H01L 51/50* (2006.01)

(52) U.S. Cl.
  CPC ...... *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5253* (2013.01); *H01L 51/5271* (2013.01); *H01L 51/5275* (2013.01); *H01L 51/5284* (2013.01)

(56) References Cited

U.S. PATENT DOCUMENTS

| 2004/0051447 | A1* | 3/2004 | Okinaka | H05B 33/22 313/504 |
|---|---|---|---|---|
| 2010/0141566 | A1 | 6/2010 | Jung et al. | |

FOREIGN PATENT DOCUMENTS

| TW | 200609654 A | 3/2006 |
|---|---|---|
| TW | 201222008 A1 | 6/2012 |
| TW | I372575 B | 9/2012 |
| TW | 201407196 A | 2/2014 |

OTHER PUBLICATIONS

Chen et al., "Light extraction from organic light emitting diode", Proc. of SPIE, vol. 6722, No. 672241, 2007, pp. 1-8.

Greiner, "Light Extraction from Organic Light Emitting Diode Substrates: Simulation and Experiment", Japanese Journal of Applied Physics, vol. 46, No. 7A, 2007, pp. 4125-4137.

Kim et al., "Improvement in Outcoupling Efficiency and Image Blur of Organic Light-Emitting Diodes by Using Imprinted Microlens Arrays", Journal of Display Technology, vol. 7, No. 7, Jul. 2011, pp. 377-381.

Kim et al., "Rapid laser fabrication of microlens array using colorless liquid photopolymer for AMOLED devices", Optics Communications, vol. 284, 2011, pp. 405-410.

Kumar et al., "Analysis of light out-coupling from microlens array", Optics Communications, vol. 284, 2011, pp. 4279-4282.

\* cited by examiner

OPTICAL FILM STRUCTURE HAVING A LIGHT ABSORBING LAYER THAT IMPROVES THE CONTRAST OF THE DISPLAY APPARATUS

This application claims the benefit of Taiwan application Serial No. 104105311, filed Feb. 16, 2015, the disclosure of which is incorporated by reference herein in its entirety.

TECHNICAL FIELD

The disclosure relates to an optical film structure and a display apparatus applying the same, and also relates to an optical film structure having micro-lens array and a display apparatus applying the same.

BACKGROUND

Currently, portable 3C (Computer, Consumer Electronics, Communication) products, such as personal digital assistants (PDAs), global positioning system (GPS), digital cameras, etc., have play an important role in modern life. These products typically use flat panel displays, such as liquid crystal displays (LCD), plasma displays or organic light emitting diode (OLED) displays, serving as the display medium for displaying images. OLED displays are characterized by features of high brightness, low power consumption, high contrast, high speed and low driving voltage.

An OLED display has a panel with multi-layers structure including a first electrode layer, a hole-injection layer, a hole-transport layer, a light-emitting layer, an electron-transport layer, an electron-injection layer and a second electrode layer stacked in sequence. In order to improve the light extraction efficiency of the OLED panel, at least one of the first electrode layer and the second electrode layer may be made by a patterned metal layer. However, since the metal layer has high reflectivity, thus most of the external light incident from the front of the display may be reflected by the metal layer, and an overall reduction in contrast may occur due to the perfect reflection of the metal layer. As a result, the display image quality of the OLED display may be deteriorated drastically, when the OLED display is operated in a circumstance with high background luminance.

SUMMARY

According to one embodiment of the present disclosure, an optical film structure is disclosed. The optical film structure includes a first substrate, an optical component, a planarization layer and a light absorbing layer. The first substrate has a first surface and a second surface. The optical component includes a micro-lens array and is disposed on the first surface of the first substrate. The micro-lens array includes a plurality of micro-lens units and each of the micro-lens units has a round concentrated area with a projected radius R formed on the first surface. The planarization layer is disposed on the optical component. The light absorbing layer is disposed on the planarization layer. The light absorbing layer includes a plurality of light absorbing units and each of the light absorbing units has a width W. Light incident from the second surface of the first substrate and passing through the micro-lens array can be focused on the light absorbing units. The micro-lens array and the planarization layer have a difference in refractive index greater than or equal to 0.2; and the width (W) is less than or equal to one-half of the projected radius (R/2).

According to another embodiment, a display apparatus is disclosed. The display apparatus includes a first substrate, an optical component, a planarization layer, a light absorbing layer, a second substrate, a display layer and an adhesive layer. The first substrate has a first surface and a second surface. The optical component includes a micro-lens array and is disposed on the first surface of the first substrate. The micro-lens array includes a plurality of micro-lens units and each of the micro-lens units has a round concentrated area with a projected radius R formed on the first surface. The planarization layer is disposed on the optical component. The light absorbing layer is disposed on the planarization layer. The light absorbing layer includes a plurality of light absorbing units and each of the light absorbing units has a width W. The display layer includes a plurality of display units disposed on the second substrate and interposed between the first substrate and the second substrate. The adhesive layer is disposed between the display layer and the light absorbing layer. Light incident from the second surface of the first substrate and passing through the micro-lens array can focus on the light absorbing units. Each of the display units is corresponding to the plurality of micro-lens units; and the width (W) of the light absorbing unit is less than or equal to one-half of the projected radius (R/2).

The present disclosure will become more readily apparent to those ordinarily skilled in the art after reviewing the following detailed description and accompanying drawings, in which:

DETAILED DESCRIPTION

The present specification discloses a number of embodiments to make the disclosure easy to understand, a number of exemplary embodiments with accompanying drawings are disclosed below with detailed descriptions. However, it should be noted that these embodiments and methods are not for limiting the disclosure. The disclosure can also be implemented by using other technical features, elements, methods and parameters. A number of exemplary embodiments are disclosed for illustrating technical features of the disclosure, not for limiting the claims of the disclosure. Anyone who is skilled in the technology field of the disclosure can make necessary modifications or variations to the structures according to the needs in actual implementations. In different drawings and embodiments, the same elements are represented by the same designations. In addition, the following description will be construed to encompass all possible implementations. For example, when stating a first feature is formed on a second feature, the description may encompass the example that the first feature is directly in contact with the second feature and the example that there exist some other elements disposed between the first feature and the second feature. In other words, the alternative embodiment that the first feature is not directly in contact with the second feature may be also interpreted as encompassed in the same disclosure concept.

Figure 1A:
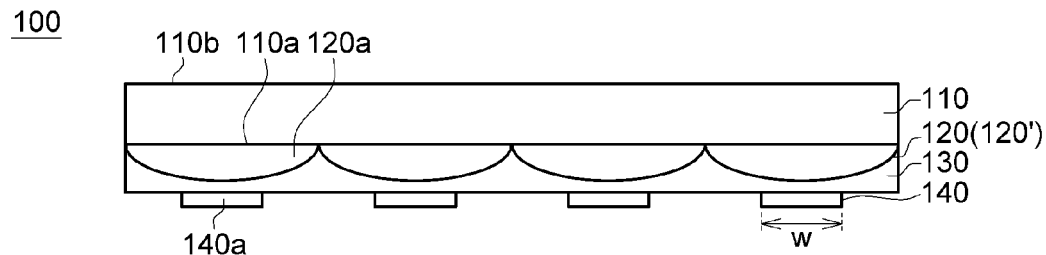
FIG. 1A is a cross-sectional view illustrating an optical film structure in accordance with one embodiment of the present disclosure.

FIG. 1A is a cross-sectional view illustrating an optical film structure 100 in accordance with one embodiment of the present disclosure.

As illustrated in FIG. 1A, the optical film structure 100 includes a first substrate 110, an optical component 120, a planarization layer 130 and a light absorbing layer 140. The first substrate 110 has a first surface 110a and a second surface 110b. The optical component 120 is disposed on the first substrate 110. The planarization layer 130 is disposed on the optical component 120. The light absorbing layer 140 is disposed on the planarization layer 130. The light absorbing layer 140 includes a plurality of light absorbing units 140a and each of the light absorbing units 140a has a width W. In some embodiments of the present disclosure, the optical component 120 includes a micro-lens array 120' and the micro-lens array 120' is constituted by a plurality of micro-lens units 120a. In the present embodiment, these micro-lens units 120a are parallel arranged on the first surface 110a of the first substrate 110 to form the micro-lens array 120', a two dimensional array arrangement with rows and columns. Two adjacent micro-lens units 120 can be either in contact with or separated from each other by a pitch. Each of the micro-lens units 120 may either have a spherical surface or an aspheric surface. The deflection of the light incident from the second surface 110b of the first substrate 110 and passing through the micro-lens array 120' may vary along with the difference in refractive index (Δn) between the micro-lens units 120a and the planarization layer 130. In other words, the incident light can be focus on a certain position (the beam focusing capability of the optical film structure 100 can be tuned) by select a certain difference in refractive index (Δn) between the micro-lens units 120a and the planarization layer 130.

Figure 1B:
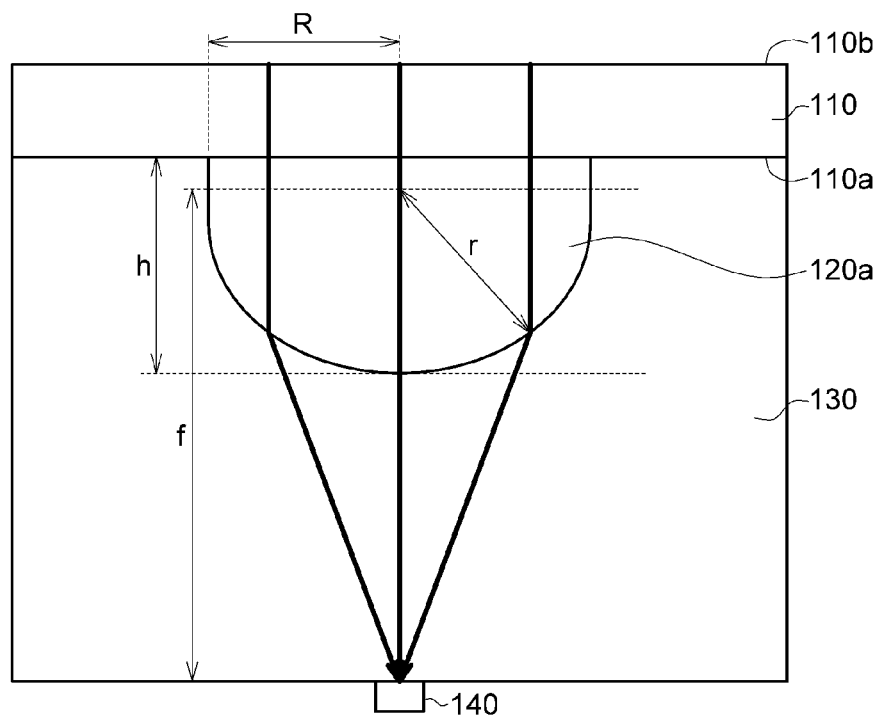
FIG. 1B is a cross-sectional view illustrating a micro-lens unit in accordance with one embodiment of the present disclosure.

FIG. 1B is a cross-sectional view illustrating a micro-lens unit 120a in accordance with one embodiment of the present disclosure. In the present embodiment, micro-lens unit 120a that are disposed on the first surface 110a of the substrate 110 has a radius of curvature r, a height h, and a focal length f. The light absorbing layer 140 is disposed substantially on the focal point of the micro-lens unit 120a, and the micro-lens unit 120a has a round concentrated area with a projected radius R formed on the first surface 110a.

Figure 2A:
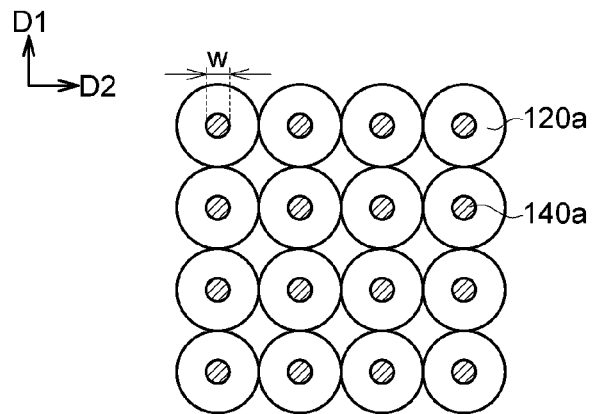
FIG. 2A is a top view illustrating a plurality of the micro-lens units and a plurality of light absorbing units in accordance with one embodiment of the present disclosure.

Referring to FIG. 2A, the light absorbing layer 140 may have a plurality of light absorbing units 140a. In one embodiment of the present disclosure, the light absorbing units 140a are arranged in an array and each of the light absorbing units 140a has a width W. For example, if the top view of each light absorbing unit 140a is shaped as a circle, the diameter of the circle can be refereed as to the width W. Light incident from the second surface 110b of the first substrate 110 may be concentrated by the micro-lens array 120' to form a plurality of light beams, and each of the light absorbing units 140a can be disposed on the focal point of one corresponding micro-lens units 120a or a position substantially adjacent to the focal point . As a result, the focused light beams can be projected on the light absorbing units 140a.

Figure 2B:
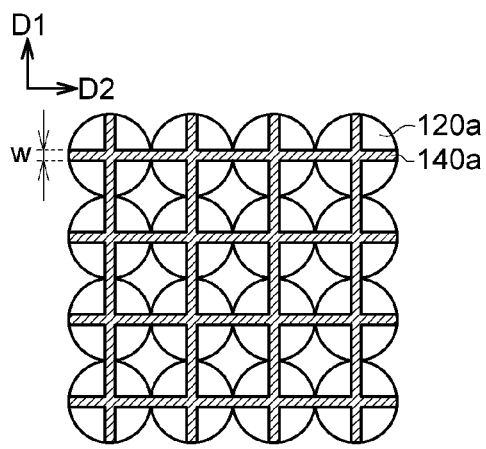
FIG. 2B is a top view illustrating a plurality of the micro-lens units and a plurality of light absorbing units in accordance with another embodiment of the present disclosure.
Figure 2C:
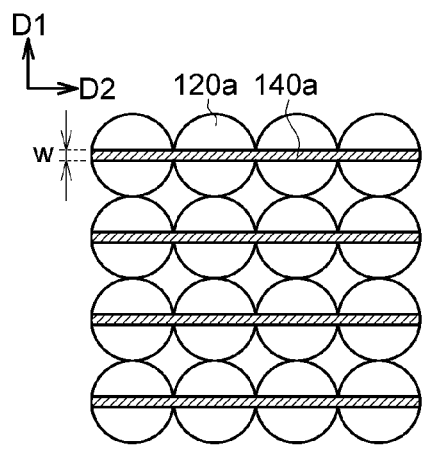
FIG. 2C is a top view illustrating a plurality of the micro-lens units and a plurality of light absorbing units in accordance with yet another embodiment of the present disclosure.

As discussed above, the light absorbing units 140a are arranged in an array, and each of the light absorbing units 140a can be disposed on a position substantially adjacent to the focal point of one corresponding micro-lens units 120a. FIG. 2A illustrates the top view of the structure constituted by the micro-lens units 120a and the light absorbing units 140a. In the present embodiment, the micro-lens units 120a are disposed on a plane substantially parallel to the first surface 110a and arranged to form a two dimensional array with rows and columns, and each of the light absorbing units 140a can be disposed on a position substantially adjacent to the focal points of one corresponding micro-lens units 120a. As a result, these light absorbing units 140a may correspondingly form another two dimensional array on another plane substantially parallel to the first surface 110a. In some embodiments of the present disclosure, these light absorbing unit 140a may be arranged to form a chessboard structure, and each of the light absorbing unit 140a may shaped as, but not limited to, a rectangle, a circle, an oval, a rhombus or any other suitable shape. The structure shown in the FIG. 2A is not depicted proportionally, and although the micro-lens array 120' are implemented by a two dimensional array arrangement with 4×4 (rows/columns) of the micro-lens units 120a, in other embodiment, the arrangement of the micro-lens units 120a for forming the micro-lens array 120' is not limited in this respect. In some embodiments, for purpose of increasing the viewing angle, the light absorbing units 140a may be connected to each other, so as to form a continuous structure, such as a planning grid structure as shown in FIGS. 2B and 2C of the optical film structure 100, to absorb the obliquely-incident light. FIG. 2B is a top view of the structure constituted by the micro-lens units 102a and the light absorbing units 140a in accordance with another embodiment of the present disclosure. The micro-lens units 120a are disposed on a plane substantially parallel to the first surface 110a and arranged to form a two dimensional array with rows and columns, and each of the light absorbing units 140a can be disposed on a position substantially adjacent to the focal points of one corresponding micro-lens units 120a. In addition, these light absorbing units 140a are connected to each other and arranged in a cross lane pattern, so as to form a planning grid structure having at least two strips respectively extending along a first direction D1 and a second direction D2 and intersecting with each other to form at least one cross as in a plus sign. In the present embodiment, the first direction D1 is substantially perpendicular to the second direction D2.

However, in some other embodiment, the arrangement of the first direction D1 and the second direction D2 is not limited in this respect. The light absorbing units 140a have a width measured along the first direction D1 either equal to or different from another width measured along the second direction D2. Similarly, the structure shown in the FIG. 2B is not depicted proportionally, and although the micro-lens array 120' are implemented by a two dimensional array arrangement with 4×4 (rows/columns) of the micro-lens units 120a, in other embodiments, the arrangement of the micro-lens units 120a for forming the micro-lens array 120' is not limited in this respect. In yet another embodiment of the present disclosure, as shown in FIG. 2C, these light absorbing units 140a are connected to each other, so as to form a multiple stripes arrangement having a plurality of strips parallel to each other and extending along one dimension (e.g. the first direction D1). The structure shown in the FIG. 2C is not depicted proportionally, and although the micro-lens array 120' are implemented by a two dimensional array arrangement with 4×4 (rows/columns) of the micro-lens units 120a, in other embodiments, the arrangement of the micro-lens units 120a for forming the micro-lens array 120' is not limited in this respect.

In one embodiment of the present disclosure, the first substrate 110 may be made of polyimide (PI), hybrid PI, polyethylene terephthalate (PET), polyethersulfone (PES), polyacrylate (PA), polyethylene naphthalate (PEN), polycarbonate (PC), polynorbornene (PNB), polyetherimide (PEI), polyetheretherketone (PEEK), cyclo olefin polymer (COP), polymethylmethacrylate (PMMA), fiberglass reinforced plastic substrate or other suitable materials. The first substrate 110 has a thickness substantially ranging from 1 μm to 500 μm, preferably from 5 μm to 30 μm.

The material used to constitute the planarization layer 130 may be transparent resin, photo-resist material, polymer or optical epoxy polymer. The thickness of the planarization layer 130 may be correlated with the beam focusing capability of the micro-lens array 120'. In some embodiments of the present disclosure, the thickness of the planarization layer 130 may be substantially equal to a focal length f of the micro-lens array 120'. The material used to constitute the micro-lens array 120' may be glass, plastic, optical epoxy polymer, photo-resist material or combinations thereof. The micro-lens units 120a may have a spherical surface with a radius of curvature r less than or equal to ($\leq$)100 μm, preferably is less than or equal to 40 μm, and more preferably is less than or equal to 20 μm. The projected radius R of the micro-lens units 120a, as shown in FIG. 1B, is the radius of the round concentrated area of the circle formed on the first surface 110a. The material used to constitute the light absorbing layer 140 may be resin, photo-resist material or optical epoxy polymer that are with light absorption ability. The thickness of the light absorbing layer 140 may be less than or equal to 10 μm, preferably is less than or equal to 5 μm, and more preferably is less than or equal to 2 μm. The micro-lens array 120' and the planarization layer 130 have a difference in refractive index ($\Delta$n) greater than or equal to 0.2.

Figure 3A:
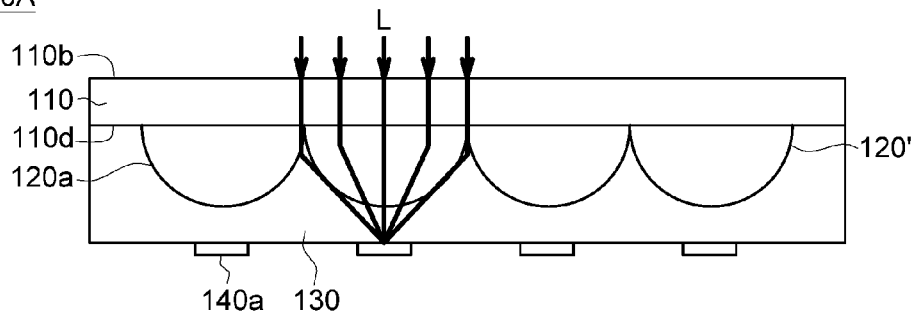
FIG. 3A is a cross-sectional view illustrating an optical film structure and an incident light passing there through in accordance with one embodiment of the present disclosure.
Figure 3B:
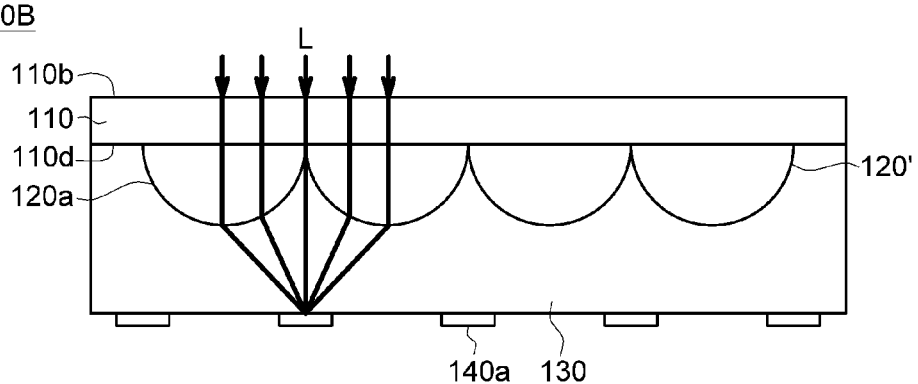
FIG. 3B is a cross-sectional view illustrating an optical film structure and an incident light passing there through in accordance with another embodiment of the present disclosure

FIGS. 3A and 3B are cross-sectional views respectively illustrating an optical film structure 300A (or 300B) and an incident light passing there through in accordance with different embodiments of the present disclosure. In FIGS. 3A and 3B, for the purposes of convenience, the identical elements of the optical film structure 300A and 300B that are also shown in FIG. 1A are represented by the same designations. Regarding to FIG. 3A, each of the micro-lens units 120a has a refractive index $n_{MLA}$, the planarization layer 130 has a refractive index $n_{PLN}$; and while the refractive index $n_{MLA}$ is greater than the refractive index $n_{PLN}$ ($n_{MLA} > n_{MLA}$), light L incident from the second surface 110b of the first substrate 110b may be concentrated by the micro-lens array 120' to form a plurality of light beams projected on the light absorbing units 140a. The light path of the incident light L may be represented by the arrows as shown in FIG. 3A. In the present embodiment, each of the light absorbing units 140a is aligned to and disposed under a corresponding micro-lens unit 120a, and the light beams are projected on the light absorbing units 140a. Regarding to FIG. 3B, each of the micro-lens units 120a has a refractive index $n_{MLA}$, the planarization layer 130 has a refractive index $n_{PLN}$, and while the refractive index $n_{MLA}$ is less than the refractive index $n_{PLN}$ ($n_{MLA} < n_{MLA}$), light L incident from the second surface 110b of the first substrate 110 may be concentrated and projected onto the light absorbing units 140a because of the difference in refractive index of the planarization layer 130 and the light absorbing units 140a. The light path of the incident light L may be represented by the arrows as shown in FIG. 3B. In the present embodiment, each of the light absorbing units 140a is disposed under a position between two adjacent micro-lens units 120a, and the light beams are projected on the light absorbing units 140a. These indicate that the focal points on which the light beams are projected or the position on which the light absorbing units 140a is disposed may vary in dependent upon the correlation in refractive index between the micro-lens units 120a and the planarization layer 130.

Figure 4:
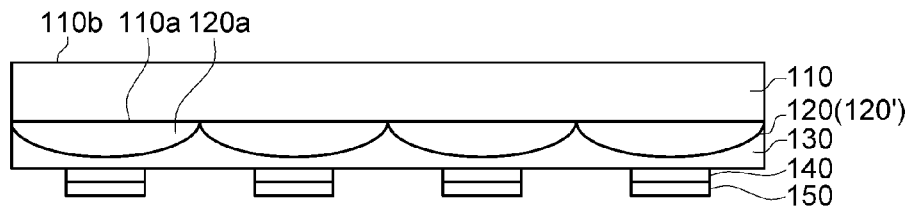
FIG. 4 is a cross-sectional view illustrating an optical film structure in accordance with yet another embodiment of the present disclosure

FIG. 4 is a cross-sectional view illustrating an optical film 400 structure in accordance with yet another embodiment of the present disclosure. In FIG. 4, for the purposes of convenience, the identical elements of the optical film structure 400 that are also shown in FIG. 1A are represented by the same designations. The structure of the optical film structure 400 is substantially identical to the optical film structure 100 shown in FIG. 1A, except that the optical film structure 400 further includes a reflecting layer 150 disposed under the light absorbing layer 140. In the present embodiment, the reflecting layer 150 is disposed on a plane substantially parallel with the first faces 110a of the substrate 110 and has a pattern thoroughly match to that of the light absorbing layer 140, the pattern arrangement as shown in FIGS. 2A to 2C. However, in some other embodiment, it is not limited in this respect. The pattern arrangement of the reflecting layer 150 may not be arranged corresponding to the pattern arrangement of the light absorbing layer 140. For example, when the light absorbing layer 140 are arranged to form a planning grid structure with a plurality of strip intersections, as shown in FIG. 2B, the pattern arrangement of the reflecting layer 150 may be alternatively shaped as a chessboard, as shown in FIG. 2A. The top view pattern of the reflecting layer 150 may be constituted by a plurality of pattern elements shaped as, but not limited to, a rectangle, a circle, an oval, a rhombus or any other suitable shape. In addition, the shapes of the top view pattern of the reflecting layer 150 and the light absorbing units 140a may be either identical to or different from each other.

The reflecting layer 150 may be made of metal, such as aluminum (Al), neodymium (Ne), silver (Ag), magnesium (Mg), titanium (Ti) or molybdenum (Mo), metallic oxide resulting from at least one of these metal elements or alloy made of the combinations of these metal elements. The thickness of the reflecting layer 150 may substantially range from 10 nm to 10μm.

Figure 5:
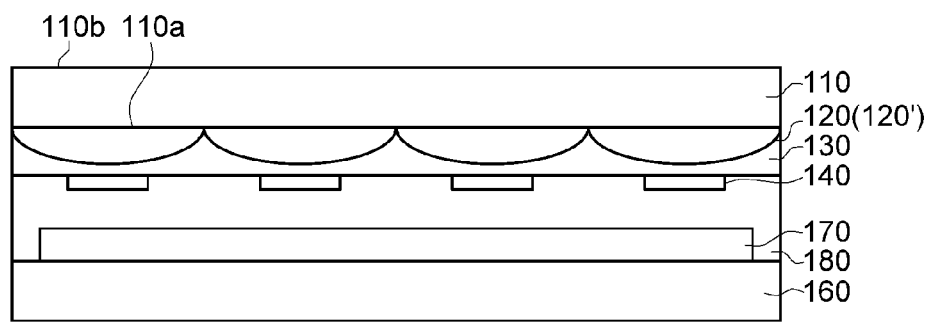
FIG. 5 is a cross-sectional view illustrating a display apparatus in accordance with one embodiment of the present disclosure

The optical film structure as described above can be integrated with a display medium to form a display apparatus. The display medium can be an LCD, a plasma display, an OLED display, an electrowetting display (EWD), an electro-phoretic display (EPD), an electrochromic display (ECD) or other suitable display medium. The resulting display apparatus may be, but not limited to, an active matrix display apparatus or a positive matrix display apparatus. The structure and method of forming these display apparatuses will be best understood from the following description:

FIG. 5 is a cross-sectional view illustrating a display apparatus in accordance with one embodiment of the present disclosure. The display apparatus may include a display layer having an LCD display, a plasma display, an OLED display, an EWD, an EPD or an ECD. The present disclosure will now be described more specifically with reference to the following embodiments illustrating a display apparatus including an OLED display. The display apparatus 500 shown in FIG. 5 includes a second substrate 160 and an OLED display layer 170 disposed on the second substrate 160, wherein the OLED display layer 170 has a plurality of OLED display units. In FIG. 5, merely one OLED display unit is depicted to represent a whole OLED display; the OLED display unit may be a pixel of a monochrome display or a sub-pixel (e.g R, G or B sub-pixel) of a color display. The OLED display layer 170 can include a first electrode layer, a hole-injection layer, a hole-transport layer, a light-emitting layer, an electron-transport layer, an electron-injection layer and a second electrode layer (not shown). The second substrate 160 faces a first substrate 110. The first substrate 110 has a first surface 110a and a second surface 110b. An optical component 120 is disposed on the first surface 110a of the first substrate 110. A planarization layer 130 is disposed on the optical component 120. A light absorbing layer 140 is disposed on the planarization layer 130. The OLED display layer 170 is disposed between the first substrate 110 and the second substrate 160. An adhesive layer 180 is disposed between the OLED display layer 170 and the light absorbing layer 140. The process for forming display apparatus 500 includes steps as follows: The OLED display layer 170 is firstly on the second substrate 160, and the optical film structure 100, as shown in FIG. 1A, is then integrated within the OLED display layer 170 in a manner of making the first surface 110a of the substrate 110 and the OLED display layer 170 facing each other and disposing the adhesive layer 180 between the first surface 110a of the substrate 110 and the OLED display layer 170. In FIG. 5, the identical elements that have been described in FIG. 1 will not be redundantly repeated here. The OLED display layer 170 depicted in FIG. 5 can represent the smallest display unit of the display apparatus 500, e.g. a pixel of a monochrome display or a sub-pixel (e.g R, G or B sub-pixel) of a color display.

Figure 6:
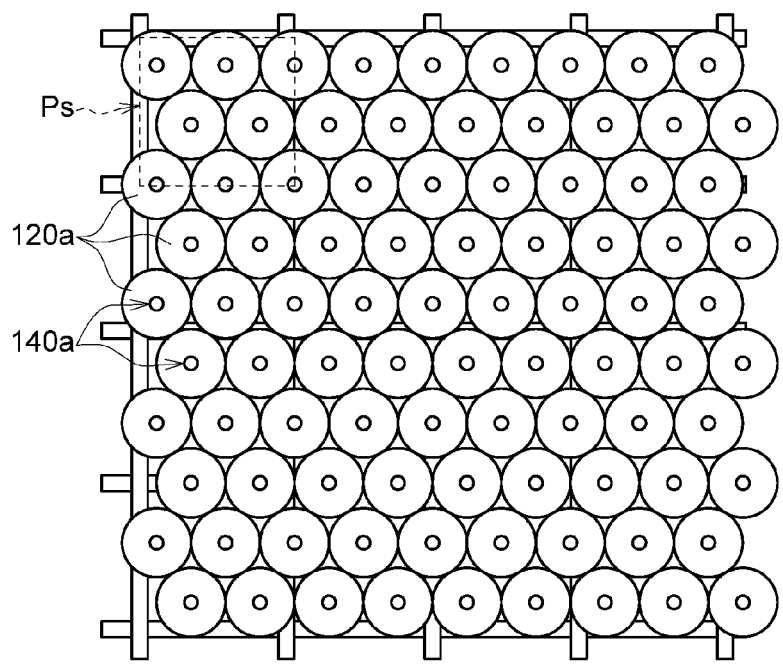
FIG. 6 is a is a top view illustrating a plurality of display units, the micro-lens units and the light absorbing units in accordance with one embodiment of the present disclosure

FIG. 6 is a is a top view illustrating a plurality of display units Ps, the micro-lens units 120a and the light absorbing units 140a in accordance with one embodiment of the present disclosure, wherein each of the display units Ps represents a pixel of a monochrome display or a sub-pixel (e.g R, G or B sub-pixel) of a color display. As shown in FIG. 6, the display units is denoted as Ps, and each of the display units Ps has a plurality of the micro-lens units 120a and a plurality of the light absorbing units 140a integrated there with.

Figure 7A:
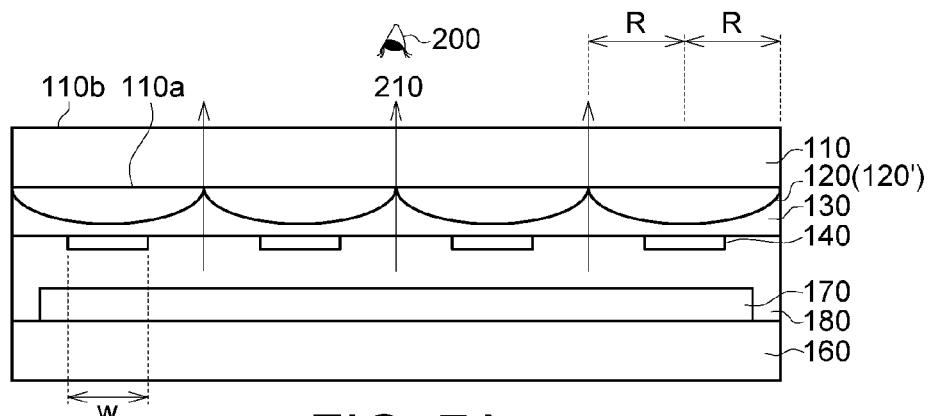
FIG. 7A is a cross-sectional view of an OLED display apparatus illustrating light exiting out of the OLED display apparatus in accordance with one embodiment of the present disclosure
Figure 7B:
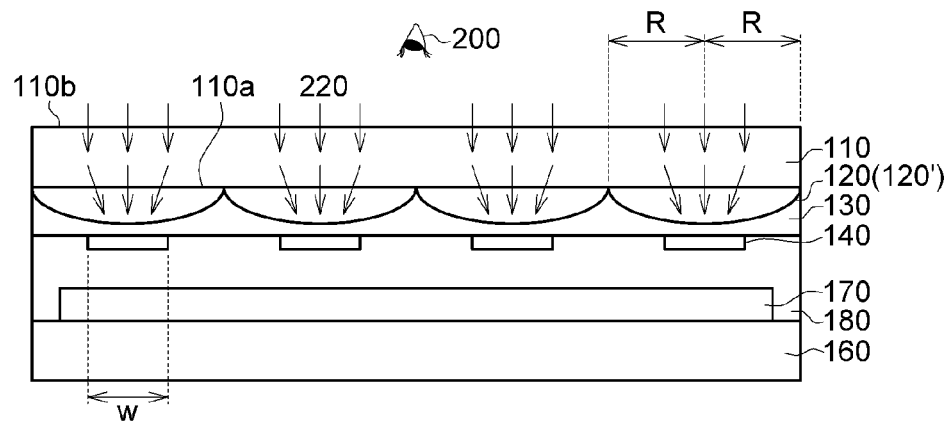
FIG. 7B is a cross-sectional view of an OLED display apparatus illustrating incident light coming into the OLED display apparatus from the external environment in accordance with another embodiment of the present disclosure

FIG. 7A is a cross-sectional view of an OLED display apparatus 700A illustrating light 210 exiting out of the OLED display apparatus 700A in accordance with one embodiment of the present disclosure. In FIG. 7A, light denoted as reference number 210 travels outward from the OLED display apparatus 700A to the eyes of a user 200, wherein arrows depicted in FIG. 7A are used to represent the light path of the exiting ligfht 210. FIG. 7B is a cross-sectional view of an OLED display apparatus 700B illustrating incident ligfht 220 coming into the OLED display apparatus 700B from the external environment in accordance with another embodiment of the present disclosure. In FIG. 7B, light denoted as reference number 220 is the incident ligfht 220 coming from the external environment and traveling into the OLED display apparatus 700B, wherein arrows depicted in FIG. 7B are used to represent the light path of the incident ligfht 220.

To take FIGS. 5, 7A and 7B into account together, in one embodiment of the present disclosure, the micro-lens array 120' constituted by these micro-lens units 120a can serve as the optical component 120, and these micro-lens units 120a are disposed on a plane substantially parallel to the first surface 110a and arranged to form a two dimensional array with rows and columns. Each of the micro-lens units 120 may either have a spherical surface or an aspheric surface. The arrangement and the forming of the light absorbing layer 140 can be referred back to the pertinent description that has already been mentioned in FIGS. 2A to 2C. The OLED display layer 170 depicted in FIG. 5 can represent the smallest display unit of the display apparatus 500, wherein each of the smallest display unit has a plurality of the micro-lens units 120 integrated there with. Referring to FIG. 7A, the exiting ligfht 210 provided by the OLED display apparatus 700A travels outward from the second surface 110b of the substrate 110. The incident ligfht 220 coming from the external environment, as shown in FIG. 7B, can pass through the second surface 110b of the substrate 110 and travel into the OLED display apparatus 700B. The incident ligfht 220 incident from second surface 110b of the substrate 110 can be concentrated to form at least one light beam condensing on the light absorbing units 140a by selecting a certain difference in refractive index (Δn) between the micro-lens units 120a and the planarization layer 130. The arrangement of the light absorbing units 140a can be referred back to the pertinent description that has already been mentioned in FIGS. 2A to 2C. Such that, the concentrated light beam cane be absorbed by the light absorbing units 140a to avoid the incident ligfht 220 coming from the external environment from traveling into the OLED display layer 170 and being reflected back to the user's 200 eyes by the metal electrodes of the OLED display layer 170.

Referring to FIGS. 7A and 7B again, each of the light absorbing units 140a has a width W. For example, if the top view of each light absorbing unit 140a is shaped as a circle, as shown in FIG. 2A, the diameter of the circle can be refereed as to the width W. In considering the capacity of the light absorbing units 140a for absorbing the incident ligfht 220 coming from the external environment, the width W of the light absorbing units 140a should be wide enough to allow the concentrated light beam projecting there on. However, there are still some limits on the width W of the light absorbing units 140a. Because, the light absorbing units 140a may absorb the exiting ligfht 210 provided by the OLED display apparatus 700A, providing the light absorbing units 140a a suitable width W can avoid too much ligfht 210 provided by the OLED display apparatus 700A from being absorbed by the light absorbing units 140a and deteriorating the display image quality thereof. In sum, the preferred width W of the light absorbing units 140a is substantially equal to or less than one-half of the projected radius R of a circle (WR/2) that is defined by the concentrated area of the micro-lens units 120a formed on the first surface 110a of the substrate 110, as shown in FIG. 1A.

In one embodiment, the material for constructing the adhesive layer 180 may be acrylic or epoxy, and the adhesive layer 180 can be a pressure sensitive adhesive or a gap-filling adhesive. The adhesive layer 180 has a thickness substantially ranging from, but not limited to, 1 μm to 50 μm. The material used to constitute the planarization layer 130 may be transparent resin, photo-resist material, polymer or optical epoxy polymer. The thickness of the planarization layer 130 may be correlated with the beam focusing capability of the micro-lens array 120'. In one embodiment of the present disclosure, the thickness of the planarization layer 130 may be correlated with the focal length of the micro-lens array 120'. The material used to constitute the micro-lens array 120' may be glass, plastic, optical epoxy polymer, photo-resist material or combinations thereof. The micro-lens units 120a may have a spherical surface with a radius of curvature r less than or equal to (≤)100 μm, preferably is less than or equal to 40 μm, and more preferably is less than or equal to 20 μm. In one embodiment, the projected radius R of the micro-lens units 120a may be greater than or equal to one-quarter (¼) of the shortest side length of the OLED display units. The projected radius R, as shown in FIG. 1B, is the radius of the circle defined by the concentrated area of the micro-lens unit 120a formed on the first surface 110a of the substrate 110. The material used to constitute the light absorbing layer 140 may be resin, photo-resist material, polymer or optical epoxy polymer with light absorption ability. The thickness of the light absorbing layer 140 may be less than or equal to 10 μm, preferably is less than or equal to 5 μm, and more preferably is less than or equal to 2 μm. The difference in refractive index (Δn) between the micro-lens array 120' and the planarization layer 130 is greater than or equal to 0.2.

Figure 8:
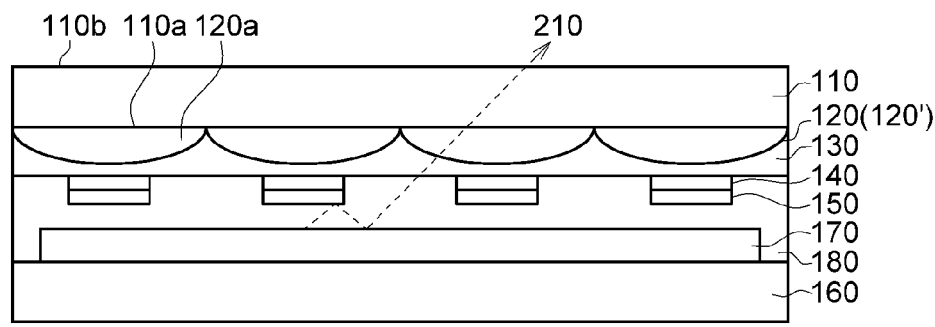
FIG. 8 is a cross-sectional view illustrating a display apparatus in accordance with yet another embodiment of the present disclosure.

FIG. 8 is a cross-sectional view illustrating a display apparatus 800 in accordance with yet another embodiment of the present disclosure. In FIG. 8, the identical elements of the display apparatus 800 that are also shown in FIG. 5 are designated by the same designations. The structure depicted in FIG. 8 is identical to that depicted in FIG. 5, except that the display apparatus 800 of FIG. 8 further includes a reflecting layer 150 disposed under the light absorbing layer 140 use to reflect a portion of the ligfht 210 provided by the OLED display layer 170 and to avoid the portion of the exiting ligfht 210 from being absorbed by the light absorbing layer 140. The portion of the exiting ligfht 210 reflected by the reflecting layer 150 can be reflected again by the electrodes (not shown) of the OLED display layer 170, depart from the second surface 110b and then arrive to the user's 200 eyes. As a result, the light extraction efficiency of the display apparatus 800 can be improved. The arrangement of the reflecting layer 150 is corresponding, but not limited, to that of the light absorbing layer 140. The arrangement of the reflecting layer 150 can be referred back to the pertinent description that has already been mentioned above.

Figure 9:
FIG. 9 is a cross-sectional view illustrating an optical film structure in accordance with yet another embodiment of the present disclosure.

FIG. 9 is a cross-sectional view illustrating an optical film structure 900 in accordance with yet another embodiment of the present disclosure. The structure of the optical film structure 900 depicted in FIG. 9 is substantially identical to the optical film structure 100 depicted in FIG. 1A, and for the purposes of convenience, the identical elements of the optical film structure 900 that are also shown in FIG. 1A are represented by the same designations. The difference between the optical film structures 100 and 900 are that the optical film structure 900 further includes a gas barrier layer 190 disposed between the first substrate 110 and the optical component 120. The gas barrier layer 190 may be made of organic material, inorganic material or transparent inorganic/organic nano-hybrid material. The organic material may be parylene, acrylic, diamond like carbon (DLC) or any other suitable organic material. The inorganic material can be silicon oxide, silicon nitride, silicon oxynitride, aluminum oxide or any other suitable inorganic material. The gas barrier layer 190 made of the inorganic/organic nano-hybrid material may be a DLC-silicon hybrid film. The gas barrier layer 190 can be implemented by either a single layer structure or a multi-layer structure. In some embodiment, the gas barrier layer 190 may be constituted by a plurality of organic layers and a plurality of inorganic layers alternatively stacked with each other. The gas barrier layer 190 can improve the ability of preventing moisture and oxygen from invading into the flexible substrate, so as to improve the reliability of the optical film structure 900 and the display apparatus applying the same. In the other embodiments, the optical film structure and the display apparatus can also have the gas barrier layer 190 disposed between the first substrate 110 and the optical component 120. For example, the display apparatus 500 shown in FIG. 5 may further have the gas barrier layer 190 disposed between the first substrate 110 and the optical component 120.

FIGS. 10A-10E are cross-sectional views illustrating a method for fabricating a display apparatus in accordance with one embodiment of the present disclosure. In the present embodiment, the optical film structure and the display apparatus applying the same are respectively configured on a flexible substrate. The method for fabricating a display apparatus includes steps as follows: A supporting plate 200 is firstly provided. The supporting plate 200 is used to support the substrate and avoid the flexible substrate from deformation during the process for manufacturing the display apparatus, so as to provide the subsequent elements a plane surface for forming thereon. The supporting plate 200 may be a glass substrate, a silicon substrate, a quartz substrate, a sapphire substrate or any other suitable rigid substrate. A release film 210 is then formed on the supporting plate 200. The release film 210 is used to enable the flexible display apparatus that is subsequently formed on the supporting plate 200 released therefrom during a substrate debonding process. The release film 210 can be made of, but not limited to, parylene. Next, an optical film structure 1000A is formed on the release film 210. The optical film structure 1000A includes a first substrate 110, the flexible substrate having a first surface 110a and a second surface 110b.

Figure 10A:
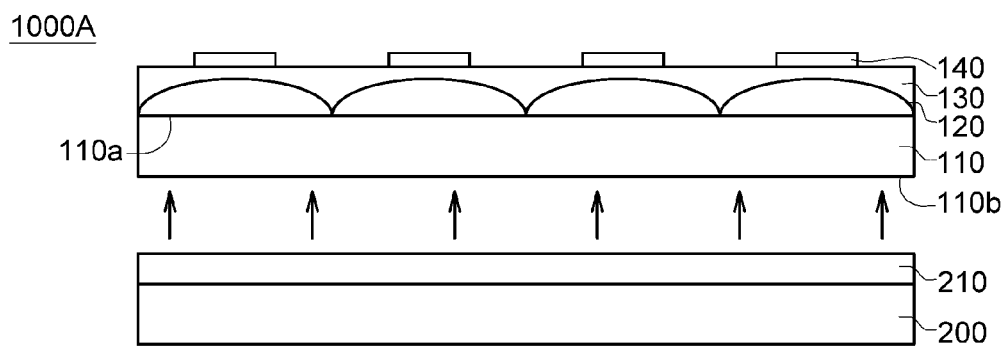
FIGS. 10A-10E are cross-sectional views illustrating a method for fabricating a display apparatus in accordance with one embodiment of the present disclosure.
Figure 10B:
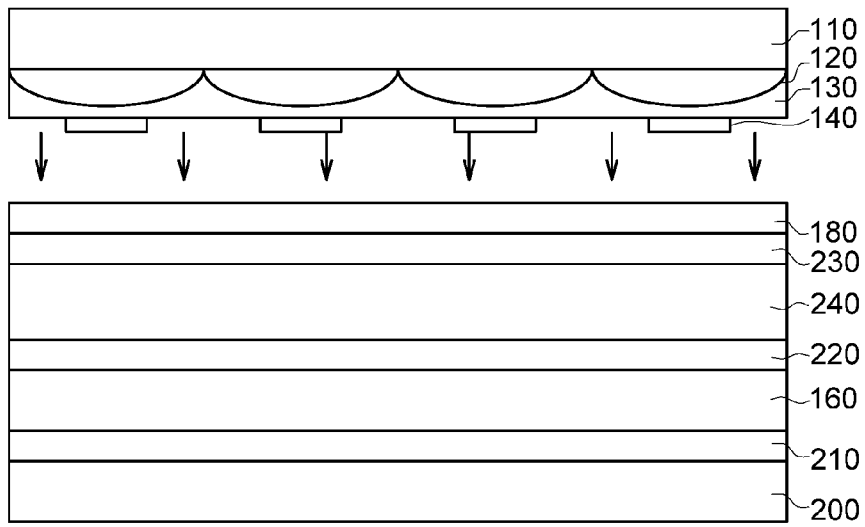
Figure 10C:
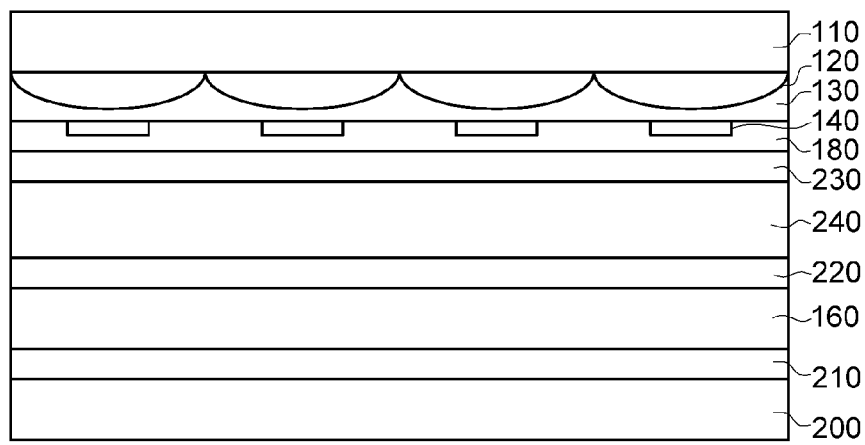
Figure 10D:
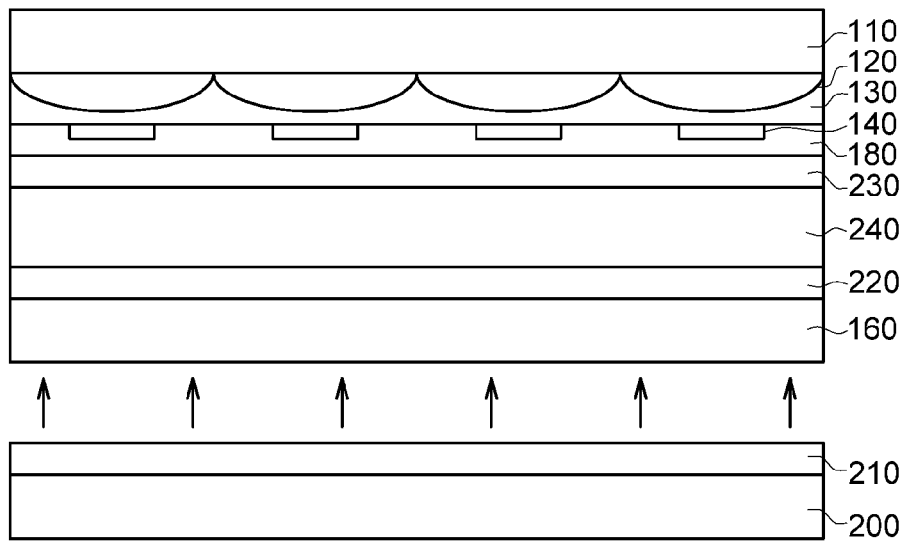
Figure 10E:
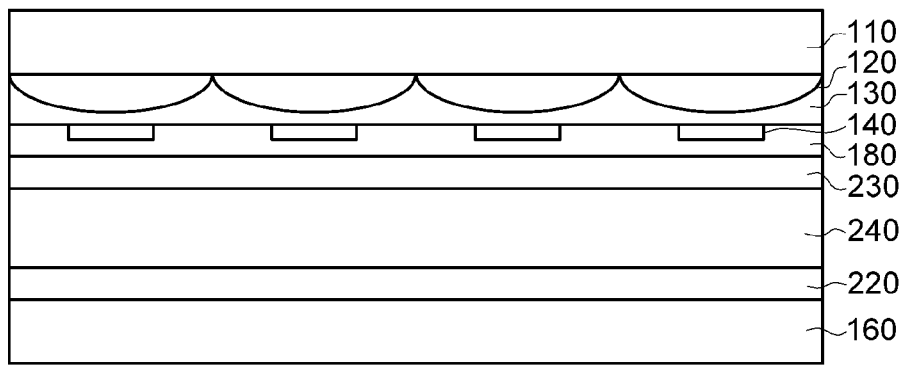

The optical film structure 1000A further includes an optical component 120 formed on the first substrate 110, a planarization layer 130 formed on the optical component 120 and a light absorbing layer 140 formed on the planarization layer 130, wherein the second surface 110b is the surface disposed adjacent to the release film 210. Referring to FIG. 10A, the substrate debonding process is performed to release the optical film structure 1000A from the supporting plate 200, meanwhile the process for forming the optical film structure 1000A is accomplished. The release film 210 is used to enable the optical film structure 1000A having a flexible substrate 110 released from the supporting plate 200 during the substrate debonding process. Referring to FIG. 10B, another supporting plate 200 is provided. The supporting plate 200 may be a glass substrate, a silicon substrate, a quartz substrate, a sapphire substrate or any other suitable rigid substrate. Another release film 210 is then formed on the supporting plate 200. The release film 210 can be made of, but not limited to, parylene. Next, a second substrate 160 is formed on the release film 210, wherein the second substrate 160 is a flexible substrate. Subsequently, a first electrode 220, a display medium 240, a second electrode 230 and an adhesive layer 180 are formed on the second substrate 160. In the present embodiment, the display medium 240 is an OLED display may include a hole-injection layer, a hole-transport layer, a light-emitting layer, an electron-transport layer and an electron-injection layer (not shown). Referring to FIG. 10B again, the optical film structure 1000A is then engaged with structure formed on the second substrate 160 by using the light absorbing layer 140 in contact with the adhesive layer 180 to form a display appartus 1000B supported by the supporting plate 200 and the release film 210, as shown in FIG. 10C. Thereafter, referring to FIG. 10D, the display appartus 1000B is released from the supporting plate 200 by a substrate debonding process, wherein release film 210 is used to enable the display appartus 1000B formed on the supporting plate 200 released therefrom during the substrate debonding process. Meanwhile the method for forming the display appartus 1000B with flexibility is accomplished.

Figure 11A:
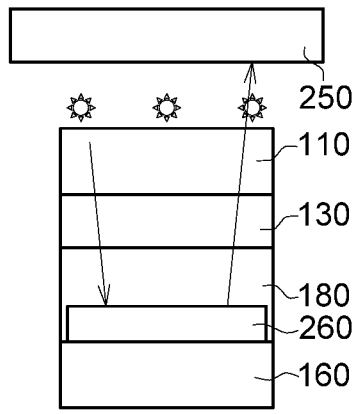
FIGS. 11A and 11B are cross-sectional views illustrating the simulated results of a light reflection test performed on two different OLED display apparatuses in accordance with one embodiment of the present disclosure.
Figure 11B:
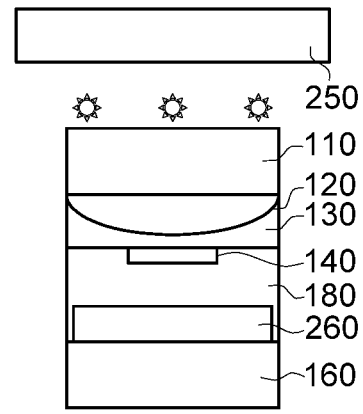

FIGS. 11A and 11B are cross-sectional views illustrating the simulated results in light reflection performed on two different OLED display apparatuses in accordance with one embodiment of the present disclosure. The simulation is performed on two different OLED display apparatuses depicted in FIGS. 11A and 11B to determine the reflectivity of the incident light coming from the external environment, wherein a reflecting mirror are utilized to simulate the metal electrodes of these OLED display apparatuses. Referring to the undermentioned table 1 as well as FIGS. 11A and 11B, FIG. 11A illustrates an OLED display apparatus without applying the aforementioned micro-lens array and the light absorbing layer. The OLED display apparatus includes a first substrate 110, a planarization layer 130, a second substrate 160 and an adhesive layer 180. The incident light (coming from the external environment) represented by the arrows as shown in FIG. 11A, has an intensity about 10000 Watt. The reflectivity of the reflected light detected by the light detector 250 is about 100%. FIG. 11B illustrates an OLED display apparatus having the aforementioned micro-lens array 120' and the light absorbing layer 140. The incident light (coming from the external environment) has an intensity about 10000 Watt, and the intensity of the reflected light detected by the light detector 250 is about 976 Watt, thus the reflectivity is about 10%. These results indicate that applying the micro-lens array 120' and the light absorbing layer 140 can reduce the converse effect caused by the light coming from the external environment and improve the contrast of the OLED display apparatus.

TABLE 1

| | Light | Intensity (Watt) | Reflectivity |
|---|---|---|---|
| | Incident light | 10000 | |
| Reflecting light | The OLED display apparatus without the micro-lens array and the light absorbing layer | 10000 | 100% |
| | OLED display apparatus applying the micro-lens array and the light absorbing layer | 976 | 10% |

Figure 12A:
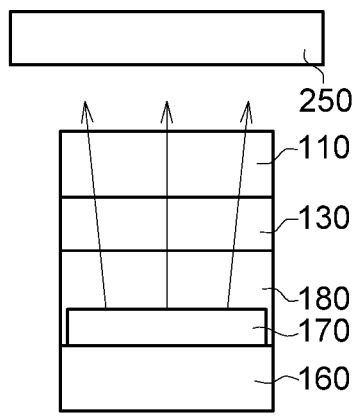
FIGS. 12A and 12B are cross-sectional views illustrating the simulated results in light transmission performed on two different OLED displays in accordance with another embodiment of the present disclosure.
Figure 12B:
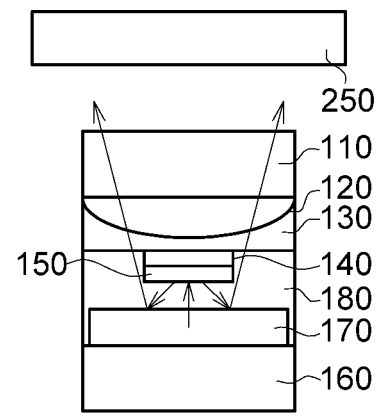

FIGS. 12A and 12B are cross-sectional views illustrating the simulated results in light transmission performed on two different OLED display apparatuses in accordance with another embodiment of the present disclosure. The simulation is performed on two different OLED display apparatuses depicted in FIGS. 12A and 12B to determine the light transmittance of the light provided by and exiting from the OLED display apparatuses. Referring to the undermentioned table 2 as well as FIGS. 12A and 12B, FIG. 12A illustrates an OLED display apparatus without applying the aforementioned micro-lens array and the light absorbing layer. The OLED display apparatus includes a first substrate 110, a planarization layer 130, a second substrate 160, an OLED display layer 170, and an adhesive layer 180. The light provided by the OLED display apparatuses, represented by the arrows as shown in FIG. 12A, has an intensity about 10000W. The transmittance of the exiting light detected by the light detector 250 is about 100%. FIG. 12B illustrates an OLED display apparatus having the aforementioned micro-lens array 120', the light absorbing layer 140 and the reflecting layer 150. The light provided by the OLED display apparatus has intensity about 10000 W, and the exiting light has intensity about 8188 W, the light transmittance detected by the light detector 250 is about 82%. These results indicate that although applying the micro-lens array 120' and the light absorbing layer 140 (and reflecting layer 150) may reduce the light extraction efficiency of the OLED display apparatuses, but the extent will not significant enough to affect the normal performance thereof.

TABLE 2

| | Light | Intensity (watt) | Transmittance |
|---|---|---|---|
| | Light provided by the OLED display apparatus | 10000 | |
| Exiting light | The OLED display apparatus without the micro-lens array and the light absorbing layer | 10000 | 100% |
| | OLED display apparatus applying the micro-lens array, the light absorbing layer and the reflecting layer | 8188 | 82% |

Figure 13:
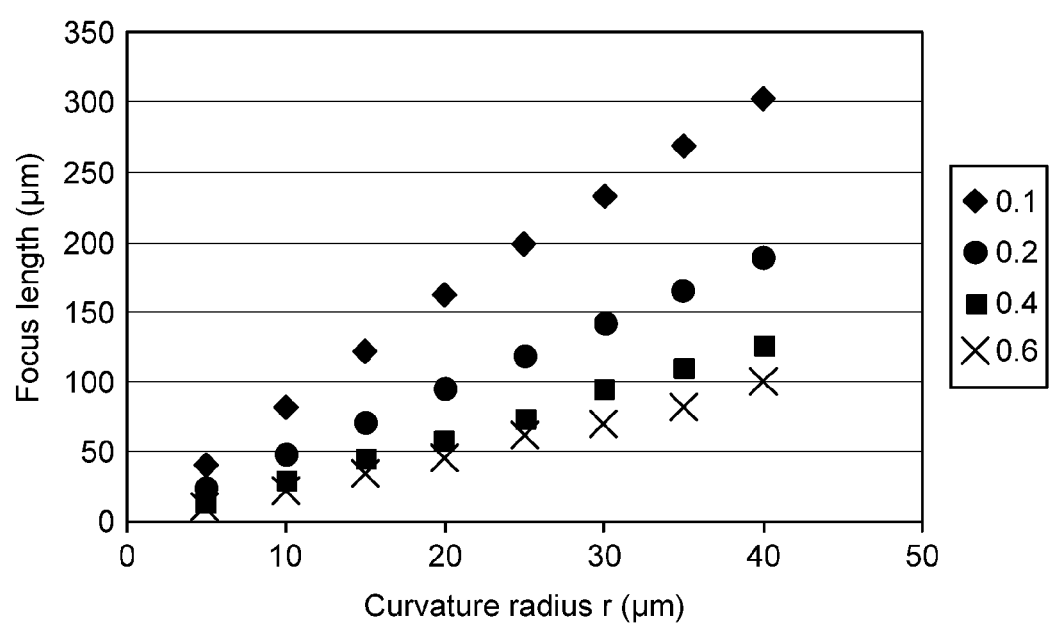
FIG. 13 is a schematic diagram illustrating the correlation between the radius of curvature r of the micro-lens units, the beam focusing capability thereof and the difference in refractive index (Δn) between the micro-lens units and a planarization layer.

As discussed above, the thickness of the micro-lens units 120a may be correlated with the beam focusing capability of the micro-lens array 120'. FIG. 13 is a schematic diagram illustrating the correlation between the radius of curvature r of the micro-lens units, the beam focusing capability thereof, and the difference in refractive index (Δn) between the micro-lens units and the planarization layer. In FIG. 13, the abscissas represent the radius of curvature r of the micro-lens units; the ordinates represent the focal length of the micro-lens units; and the curves respectively represent the correlations of the radius of curvature r and the focal length while the difference in refractive index (Δn) is 0.1, 0.2, 0.4 and 0.6. These results indicate that when the radius of curvature r of the micro-lens units is fixed, if the difference in refractive index (Δn) is getting greater, the focal length of the micro-lens units may be getting shorter. In other words, while the beam focusing capability of the micro-lens units is getting better, the thickness of the display apparatus can be getting thinner. In addition, when the difference in refractive index (Δn) is fixed, if the radius of curvature r of the micro-lens units is getting smaller, the focal length of the micro-lens units may be getting shorter. The same conclusion can be obtained that while the beam focusing capability of the micro-lens units is getting better, the thickness of the display apparatus can be getting thinner. In order to make the display apparatus thinner and more flexible, the focal length of the micro-lens array may be equal to or less than 100 μm, preferable is equal to or less than 50 μm. In one embodiment of the present disclosure, when the difference in refractive index Δn is about 0.1, the radius of curvature r of the micro-lens units should be equal to or less than 10 μm in order to make the micro-lens array with a focal length equal to or less than 100 μm possible. Since forming micro-lens units with radius of curvature r equal to or less than 10 μm may hit the process limits, thus it may be more practical to keep the difference in refractive index equal to or greater than 0.2 (Δn≥0.2) at the time when the application is applied. For purpose of material selection, in some other embodiment, the difference in refractive index may be equal to or less than 0.6 (Δn≤0.6). In one embodiment, it is approved that when the difference in refractive index is equal to 0.6 (Δn=0.6) and radius of curvature is equal to or less than 40 μm (r 40 μm), the focal length of the micro-lens array may be equal to or less than 100 μm. Thus, a micro-lens array having a plurality of micro-lens units with radius of curvature r equal to or less than 40 μm is more preferable.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An optical film structure, comprising:
   a first substrate having a first surface and a second surface;
   an optical component having a micro-lens array disposed on the first surface of the first substrate, wherein the micro-lens array includes a plurality of micro-lens units and each of the plurality of micro-lens units has a round concentrated area with a projected radius (R) formed on the first surface;
   a planarization layer disposed on the optical component; and
   a light absorbing layer disposed on the planarization layer and having a plurality of light absorbing units, wherein each of the plurality of light absorbing units has a width (W),
   wherein light incident from the second surface of the first substrate passing through the micro-lens array is focused on the plurality of light absorbing units, a difference in refractive index (Δn) between the micro-lens array and the planarization layer is greater than or equal to 0.2, and the width (W) of the light absorbing unit is less than or equal to one-half of the projected radius (R/2).

2. The optical film structure according to claim 1, wherein each of the micro-lens units has a radius of curvature equal to or less than 40 μm.

3. The optical film structure according to claim 1, wherein the plurality of light absorbing units are configured corresponding to the plurality of micro-lens units.

4. The optical film structure according to claim 1, wherein the plurality of light absorbing units are disposed substantially on focal points of the plurality of micro-lens units and arranged in a checkerboard pattern on a plane substantially parallel to the first surface.

5. The optical film structure according to claim 1, wherein the plurality of light absorbing units are disposed substantially on focal points of the plurality of micro-lens units and arranged in a cross lane pattern on a plane substantially parallel to the first surface.

6. The optical film structure according to claim 1, wherein the plurality of light absorbing units are disposed substantially on focal points of the plurality of micro-lens units and connected to each other, so as to form a multiple strips arrangement on a plane substantially parallel to the first surface.

7. The optical film structure according to claim 1, further comprising a reflecting layer disposed on the light absorbing layer.

8. The optical film structure according to claim 1, further comprising a gas barrier layer disposed between the first substrate and the optical component.

9. A display apparatus, comprising:
   a first substrate having a first surface and a second surface;
   an optical component having a micro-lens array disposed on the first surface of the first substrate, wherein the micro-lens array includes a plurality of micro-lens units and each of the plurality of micro-lens units has a round concentrated area with a projected radius (R) formed on the first surface;
   a planarization layer disposed on the optical component;
   a light absorbing layer disposed on the planarization layer and having a plurality of light absorbing units, wherein each of the plurality of light absorbing units has a width (W);
   a second substrate; and
   a display layer having a plurality of display units disposed on the second substrate and interposed between the first substrate and the second substrate,
   wherein light incident from the second surface of the first substrate passing through the micro-lens array is focused on the plurality of light absorbing units, each of the plurality of display units is corresponding to multiple micro-lens units, and the width (W) of the light absorbing unit is less than or equal to one-half of the projected radius (R/2).

10. The display apparatus according to claim 9, wherein a difference in refractive index (Δn) between the micro-lens array and the planarization layer is greater than or equal to 0.2.

11. The display apparatus according to claim 9, wherein each of the plurality of micro-lens units has a radius of curvature equal to or less than 40pm.

12. The display apparatus according to claim 9, wherein the projected radius R of the micro-lens units is greater than or equal to one-quarter (¼) of a shortest side length of the display units.

13. The display apparatus according to claim 9, further comprising an adhesive layer disposed between the display layer and the light absorbing layer.

14. The display apparatus according to claim 9, wherein the display layer is a liquid crystal display (LCD), a plasma display, an organic light emitting diode (OLED) display, an electrowetting display (EWD), an electro-phoretic display (EPD) or an electrochromic display (ECD).

15. The display apparatus according to claim 14, wherein the display layer is an OLED display comprising a first electrode layer, a hole-injection layer, a hole-transport layer, a light-emitting layer, an electron-transport layer, an electron-injection layer and a second electrode layer.

16. The display apparatus according to claim 9, wherein the plurality of light absorbing units are configured corresponding to the plurality of micro-lens units.

17. The display apparatus according to claim 9, wherein the plurality of light absorbing units are disposed substantially on focal points of the plurality of micro-lens units and arranged in a checkerboard pattern on a plane substantially parallel to the first surface.

18. The display apparatus according to claim 9, further comprising a reflecting layer disposed on the light absorbing layer.

19. The display apparatus according to claim 9, further comprising a gas barrier layer disposed between the first substrate and the optical component.

* * * * *